(12) United States Patent
Song

(10) Patent No.: US 10,256,283 B2
(45) Date of Patent: Apr. 9, 2019

(54) ORGANIC LIGHT EMITTING DISPLAY DEVICE WITH IMPROVED PAD AREA AND METHOD FOR FABRICATING THE SAME

(71) Applicant: LG DISPLAY CO., LTD., Seoul (KR)

(72) Inventor: Hyunjoo Song, Seongnam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/277,824

(22) Filed: Sep. 27, 2016

(65) Prior Publication Data

US 2017/0154939 A1 Jun. 1, 2017

(30) Foreign Application Priority Data

Nov. 30, 2015 (KR) .................. 10-2015-0169418

(51) Int. Cl.
| | |
|---|---|
| *H01L 27/32* | (2006.01) |
| *H01L 25/16* | (2006.01) |
| *H01L 51/52* | (2006.01) |
| *H01L 51/56* | (2006.01) |
| H01L 27/12 | (2006.01) |

(52) U.S. Cl.
CPC ........ *H01L 27/3262* (2013.01); *H01L 25/167* (2013.01); *H01L 27/3276* (2013.01); *H01L 51/5253* (2013.01); *H01L 51/56* (2013.01); *H01L 27/1218* (2013.01); *H01L 2227/323* (2013.01); *H01L 2227/326* (2013.01); *H01L 2251/5338* (2013.01)

(58) Field of Classification Search
CPC ............... H01L 27/3262; H01L 25/167; H01L 51/5253; H01L 27/3276; H01L 51/56; H01L 2251/5338; H01L 2227/323; H01L 27/1218
See application file for complete search history.

(56) References Cited

U.S. PATENT DOCUMENTS

| | | | |
|---|---|---|---|
| 2008/0042549 A1 | 2/2008 | Song et al. | |
| 2008/0048948 A1 | 2/2008 | Koh et al. | |
| 2013/0069853 A1* | 3/2013 | Choi ................... | H01L 27/3276 345/80 |
| 2014/0003022 A1 | 1/2014 | Lee | |
| 2014/0132487 A1* | 5/2014 | Park .................... | G02F 1/13454 345/55 |
| 2015/0062101 A1* | 3/2015 | Kim ..................... | G06F 3/0416 345/206 |

FOREIGN PATENT DOCUMENTS

| | | |
|---|---|---|
| CN | 101127172 A | 2/2008 |
| CN | 101131800 A | 2/2008 |

* cited by examiner

*Primary Examiner* — Thanh T Nguyen
(74) *Attorney, Agent, or Firm* — Birch, Stewart, Kolasch & Birch, LLP

(57) ABSTRACT

An organic light emitting display (OLED) device capable of preventing a pad area of an organic light emitting display panel from being rolled, and a method of fabricating the same, in which the OLED device can include a base film including a display area, and a first pad area provided with first pads, in which the first pad area extends from and protrudes out of a first side of the display area; a plurality of thin film transistors on the base film; and a plurality of organic light emitting diodes on the thin film transistors.

31 Claims, 15 Drawing Sheets

ORGANIC LIGHT EMITTING DISPLAY DEVICE WITH IMPROVED PAD AREA AND METHOD FOR FABRICATING THE SAME

CROSS REFERENCE TO RELATED APPLICATIONS

This application claims the benefit of the Korean Patent Application No. 10-2015-0169418 filed in the Republic of Korea on Nov. 30, 2015, which is hereby incorporated by reference as if fully set forth herein.

BACKGROUND

Field of the Disclosure

Embodiments of the present invention relate to an organic light emitting display device, and a method for fabricating the same.

Discussion of the Related Art

With the advancement of an information-oriented society, an importance of a flat panel display device (FPD) having good properties of lightness, slimness and low power consumption has been increased. The flat panel display device may include a liquid crystal display (LCD), a plasma display panel (PDP), a organic light emitting display (OLED), and etc. Recently, an electrophoretic display device (EPD) is also used widely.

Among the aforementioned flat panel display devices, the OLED and the LCD with a thin film transistor have advantages of good resolution, great color display quality, and good picture quality, whereby they are widely used for display devices of a television, a notebook computer, a tablet computer, or a desktop computer.

Especially, the OLED device, which is a self light emitting display device, has advantages of low power consumption, rapid response speed, high emission efficiency, high luminance and wide viewing angle. Thus, the OLED device has attracted great attention as a next generation flat display device.

A related art organic light emitting display panel may include a base film, a buffer layer, a thin film transistor, and an organic light emitting diode. The base film is prepared on an auxiliary substrate, in which the base film may be a flexible plastic film. The buffer layer is prepared on the base film, and the thin film transistor is prepared on the buffer layer. The organic light emitting diode is prepared on the thin film transistor, and the organic light emitting diode is electrically connected with the thin film transistor. The related art organic light emitting display panel may be fabricated by sequentially providing the base film, the buffer layer, the thin film transistor, and the organic light emitting diode on the auxiliary substrate, and separating the base film from the auxiliary substrate through the use of laser.

The buffer layer is obtained by depositing a plurality of inorganic films on the base film so as to protect a semiconductor layer of the thin film transistor. The thin film transistor is prepared on the semiconductor layer. A process of fabricating the thin film transistor may include several thermal treatments. In this instance, a thermal expansion coefficient of the base film is different from a thermal expansion coefficient of the inorganic films, whereby it may cause the increase of stress between the base film and the inorganic films. Thus, after separating the base film from the auxiliary substrate, a pad area of the base film may become rolled.

SUMMARY

Accordingly, embodiments of the present invention are directed to an organic light emitting display (OLED) device that substantially obviates one or more problems due to limitations and disadvantages of the related art, and a method of fabricating the same.

An aspect of embodiments of the present invention is to provide an organic light emitting display (OLED) device which is capable of preventing a pad area of an organic light emitting display panel from being rolled, and a method of fabricating the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting display (OLED) device that may include a base film having a display area, and a first pad area provided with first pads, wherein the first pad area extends from and protrudes out of a first side of the display area; thin film transistors prepared on the base film; and organic light emitting diodes prepared on the thin film transistors.

In another aspect of an embodiment of the present invention, there is provided a method for fabricating the OLED device that may include providing a base film on an auxiliary substrate; providing thin film transistors and first pads on the base film; providing organic light emitting diodes connected with the thin film transistors, and providing an encapsulation layer for covering the organic light emitting diodes; attaching source flexible films onto the first pads; separating the base film from the auxiliary substrate; and cutting a part between each of the source flexible films by the use of laser.

It is to be understood that both the foregoing general description and the following detailed description of the present invention are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, an organic light emitting display (OLED) device according to an embodiment of the present invention and a method for fabricating the same will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Figure 1:
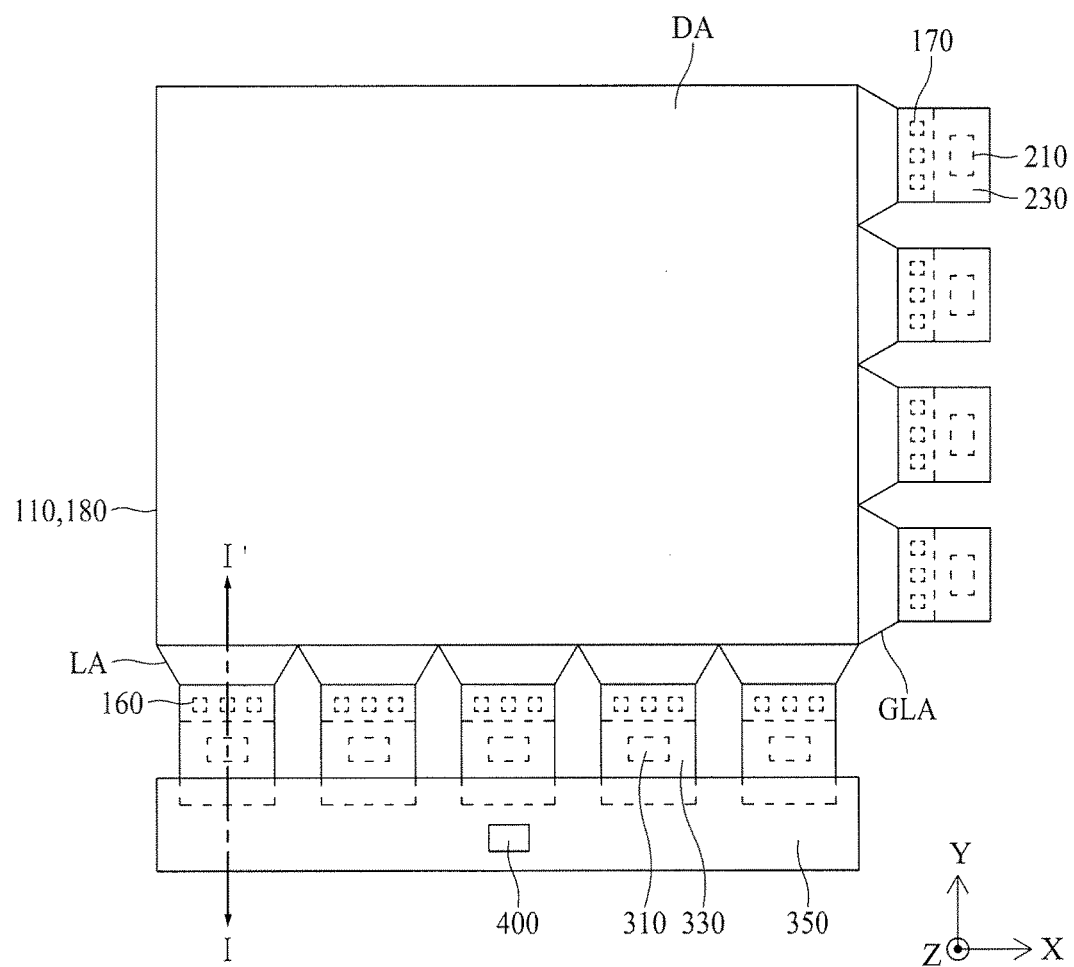
FIG. 1 is an exemplary view illustrating an OLED device according to an embodiment of the present invention.
Figure 2:
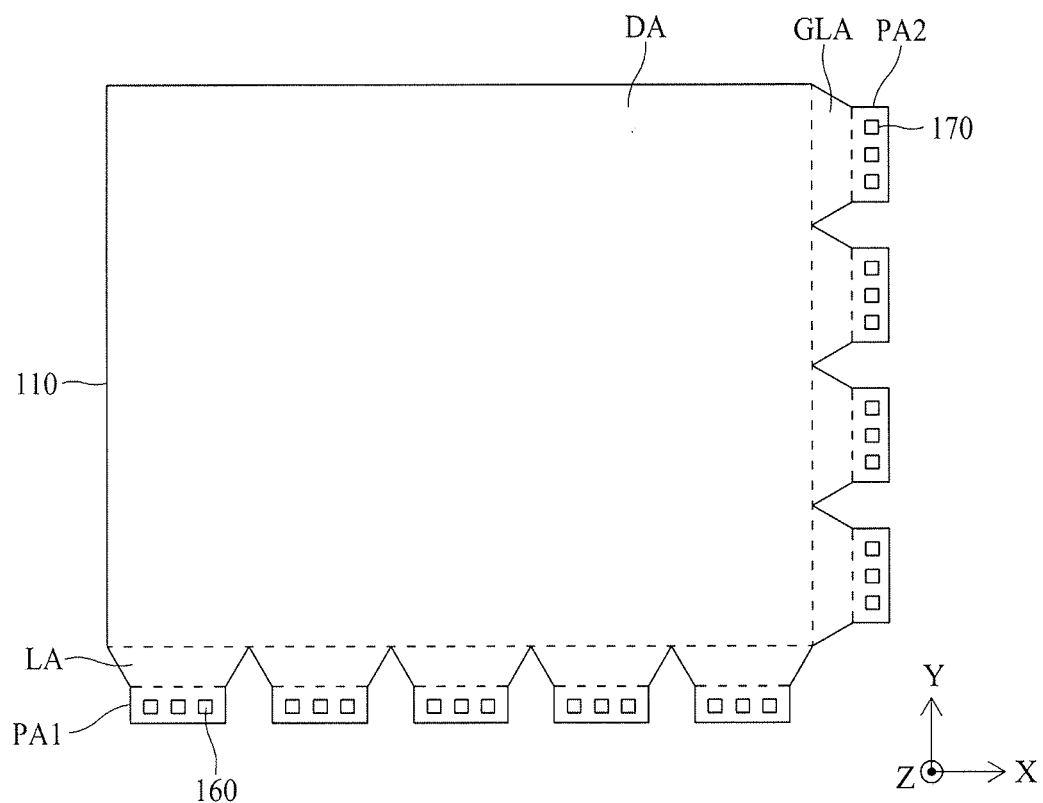
FIG. 2 is a plane view illustrating a base film according to one embodiment of the present invention.
Figure 3:
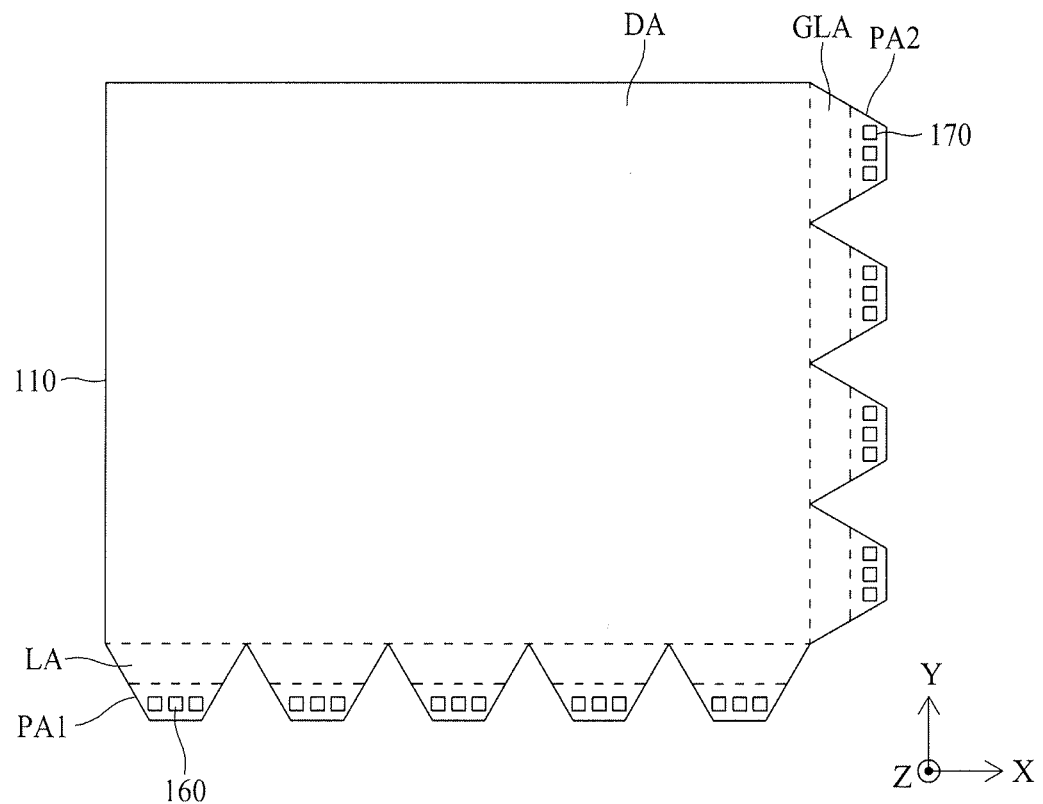
FIG. 3 is a plane view illustrating a base film according to another embodiment of the present invention.
Figure 4:
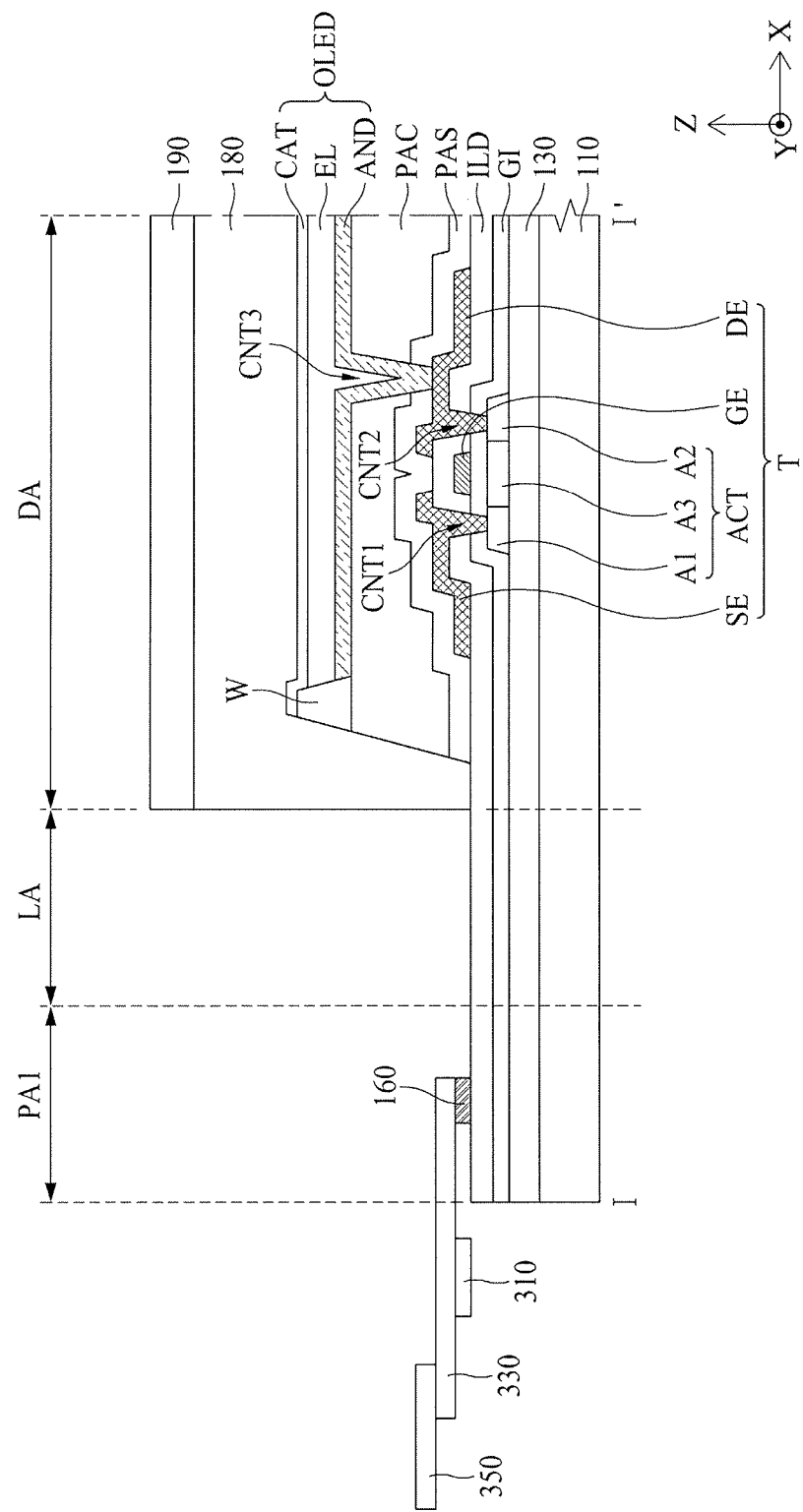
FIG. 4 is a cross sectional view along line I-I' of FIG. 1.

FIG. 1 is an exemplary view illustrating an OLED device according to an embodiment of the present invention. FIG. 2 is a plane view illustrating a base film according to one embodiment of the present invention. FIG. 3 is a plane view illustrating a base film according to another embodiment of the present invention. FIG. 4 is a cross sectional view along line I-I' of FIG. 1.

In FIG. 1, the X-axis indicates a direction parallel to a gate line, the Y-axis indicates a direction parallel to a data line, and the Z-axis indicates a length direction of the OLED device. In FIG. 1, a dotted-line indicates structures which are not shown while being covered by a gate flexible film, a source flexible film, and a circuit board.

Referring to FIGS. 1 to 4, the OLED device according to an embodiment of the present invention may include an organic light emitting display panel 100, a gate driving circuit 210, a gate flexible film 230, a source driving circuit 310, a source flexible film 330, a circuit board 350, and a timing controller 400.

The organic light emitting display panel 100 may include a base film 110, a buffer layer 130, a thin film transistor (T), a passivation layer (PAS), a planarization layer (PAC), an organic light emitting diode (OLED), and an encapsulation layer 180.

The base film 110 may include a display area (DA), a link line area (LA), a first pad area (PA1), a gate link line area (GLA), and a second pad area (PA2). In the display area (DA), there are the thin film transistor (T) and the organic light emitting diode (OLED). The link line area (LA) is disposed between the display area (DA) and the first pad area (PA1). As shown in FIGS. 2 and 3, the link line area (LA) may be formed in a trapezoid shape. The link line area (LA) may include link lines electrically connected with first lines. The link lines are electrically connected with the first lines prepared in the display area (DA). Through the link lines of the link line area (LA), first pads 160 prepared in the first pad area (PA1) are electrically connected with the first lines of the display area (DA). In this instance, the first lines may be source or data lines.

The first pad area (PA1) may extend and protrude out of a first side of the display area (DA). Between the first pad area (PA1) and the display area (DA), there is the aforementioned link line area (LA). As shown in FIGS. 2 and 3, the first pad area (PA1) may have a trapezoid or rectangular shape, but the first pad area is not limited to these shapes. Also, the first pad area (PA1) may have a triangle shape. A size of the rectangular shape for the first pad area (PA1) is relatively larger than a size of the trapezoid shape for the first pad area (PA1). Thus, if the first pad area (PA1) has the rectangular shape, it is possible to secure a sufficient space for the first pads 160. On the first pad area (PA1), there are the first pads 160 attached to the source flexible film 330. The first pads 160 may be prepared at the same time by the process of fabricating source electrode (SE) and drain electrode (DE) of the thin film transistor (T). Accordingly, the first pads 160 and the source and drain electrodes (SE, DE) may be formed of the same material.

The gate link line area (GLA) is disposed between the display area (DA) and the second pad area (PA2). In the gate link line area (GLA), there are gate link lines. The gate link lines and a gate electrode (GE) may be prepared at the same time, and may be formed of the same material. Through the gate link lines, second lines prepared in the display area (DA) may be connected with second pads 170. In this instance, the second lines may be gate lines.

The second pad area (PA2) may extend from and protrude out of a second side of the display area (DA). Between the second pad area (PA2) and the display area (DA), there is the aforementioned gate link line area (GLA). In this instance, as shown in FIGS. 2 and 3, the second pad area (PA2) may have a trapezoid or rectangular shape, but not limited to these shapes. In addition, the first pad area (PA2) may have a triangle shape. A size of the rectangular shape for the second pad area (PA2) is relatively larger than a size of the trapezoid shape for the second pad area (PA2). Thus, if the second pad area (PA2) has the rectangular shape, it is possible to secure a sufficient space for the second pads 170. On the second pad area (PA2), there are the second pads 170 attached to the gate flexible film 230. The second pads 170 may be prepared at the same time by the process of fabricating the gate electrode (GE) of the thin film transistor (T). Accordingly, the second pads 170 and the gate electrode (GE) may be formed of the same material.

The base film 110 may be a flexible plastic film. For example, the base film 110 may be a sheet or film including cellulose resin such as TAC (triacetyl cellulose) or DAC (diacetyl cellulose), COP (cyclo olefin polymer) such as Norbornene derivatives, COC (cyclo olefin copolymer), acrylic resin such as PMMA (poly(methylmethacrylate), polyolefin such as PC (polycarbonate), PE (polyethylene) or PP (polypropylene), polyester such as PVA (polyvinyl alcohol), PES (poly ether sulfone), PEEK (polyetheretherketone), PEI (polyetherimide), PEN (polyethylenenaphtha-late), PET (polyethyleneterephthalate), and etc., PI (polyimide), PSF (polysulfone), or fluoride resin, but not limited to these materials.

The buffer layer 130 is prepared on the base film 110. The buffer layer 130 prevents the properties of the thin film transistor (T) from being lowered by a moisture permeation from the base film 110 into the inside of the organic light emitting display panel 100, in which the base film 110 may be vulnerable to the moisture permeation. Also, the buffer layer 130 prevents foreign matters such as metal ions of the base film 110 from being diffused and permeated into an active layer (ACT). In order to realize the above functions of the buffer layer 130, the buffer layer 130 may include at least one inorganic film. For example, the buffer layer 130 may be formed in a single-layered structure or multi-layered structure of $SiO_2$ (silicon dioxide), SiNx (silicon nitride), or SiON (silicon oxynitride), but not limited to these structures.

The thin film transistor (T) is prepared in the display area (DA) of the base film 110. The thin film transistor (T) may include the active layer (ACT), a gate insulator (GI), the gate electrode (GE), an interlayer dielectric (ILD), the source electrode (SE), and the drain electrode (DE). The active layer (ACT) is prepared on the buffer layer 130. The active layer (ACT) may include one end area (A1) positioned at the side of the source electrode (SE), the other end area (A2) positioned at the side of the drain electrode (DE), and a central area (A3) positioned between one end area (A1) and the other end area (A2). The central area (A3) may be formed of a semiconductor material which is not doped with dopant, and one end area (A1) and the other end area (A2) may be formed of a semiconductor material which is doped with dopant.

The gate insulator (GI) is prepared on the active layer (ACT). The gate insulator (GI) insulates the active layer (ACT) and the gate electrode (GE) from each other. The gate insulator (GI), which covers the active layer (ACT), is provided on an entire surface of the display area (DA). For example, the gate insulator (GI) may be formed in a single-layered structure or multi-layered structure of $SiO_2$ (silicon dioxide), SiNx (silicon nitride), or SiON (silicon oxynitride), but not limited to these structures.

The gate electrode (GE) is prepared on the gate insulator (GI). The gate electrode (GE) overlaps with the central area (A3) of the active layer (ACT), in which the gate insulator (GI) is interposed between the gate electrode (GE) and the central area (A3) being overlapped with each other. For example, the gate electrode (GE) may be formed in a single-layered structure or multi-layered structure of any one of molybdenum (Mo), aluminum (Al), chrome (Cr), aurums (Au), titanium (Ti), nickel (Ni), neodymium (Nd) and copper (Cu), or their alloys, but the gate electrode (GE) is not limited to these structures.

The interlayer dielectric (ILD) is prepared on the gate electrode (GE). The interlayer dielectric (ILD), which covers the gate electrode (GE), is prepared on an entire surface of the gate electrode (GE). For example, the interlayer dielectric (ILD) is formed of the same inorganic material film as the gate insulator (GI), for example, a single-layered structure or multi-layered structure of $SiO_2$ (silicon dioxide), SiNx (silicon nitride), or SiON (silicon oxynitride), but not limited to these structures.

The source electrode (SE) and the drain electrode (DE) are disposed on the interlayer dielectric (ILD), in which the source electrode (SE) and the drain electrode (DE) are provided at a predetermined interval from each other. In the aforementioned gate insulator (GI) and the interlayer dielectric (ILD), there are a first contact hole (CNT1) for exposing a predetermined portion of one end area (A1) of the active layer (ACT), and a second contact hole (CNT2) for exposing a predetermined portion of the other end area (A2) of the active layer (ACT). The source electrode (SE) is connected with one end area (A1) of the active layer (ACT) via the first contact hole (CNT1), and the drain electrode (DE) is connected with the other end area (A2) of the active layer (ACT) via the second contact hole (CNT2).

A structure of the thin film transistor (T) is not limited to the above structure, that is, a structure of the thin film transistor (T) may be changed to various shapes generally known to those in the art.

The passivation layer (PAS) is prepared on the thin film transistor (T). The passivation layer (PAS) protects the thin film transistor (T). For example, the passivation layer (PAS) may be formed in a single-layered structure or multi-layered structure of $SiO_2$ (silicon dioxide), SiNx (silicon nitride), or SiON (silicon oxynitride), but the passivation layer (PAS) is not limited to these structures.

The planarization layer (PAC) is prepared on the passivation layer (PAS) of the display area (DA). The planarization layer (PAC) is provided to planarize an upper surface of the base film 110 with the thin film transistor (T). For example, the planarization layer (PAC) may be formed of acryl resin, epoxy resin, phenolic resin, polyamides resin, polyimides resin, and etc., but not limited to these materials. In the passivation layer (PAS) and the planarization layer (PAC) in the display area (DA), there is a third contact hole (CNT3) for exposing the drain electrode (DE) of the thin film transistor (T). The drain electrode (DE) and an anode electrode (AND) are connected with each other via the third contact hole (CNT3).

The organic light emitting diode (OLED) is prepared on the thin film transistor (T). The organic light emitting diode (OLED) may include the anode electrode (AND), an organic layer (EL), and a cathode electrode (CAT). The anode electrode (AND) is connected with the drain electrode (DE) of the thin film transistor (T) via the third contact hole (CNT3) prepared in the passivation layer (PAS) and the planarization layer (PAC). Also, a bank (W) is prepared between the neighboring anode electrodes (AND), whereby the neighboring anode electrodes (AND) are electrically insulated from each other by the bank (W) prepared in-between. For example, the bank (W) may be formed of an organic film of polyimides resin, acryl resin, benzocyclobutene (BCB), and etc., but the bank (W) is not limited to these materials.

The organic layer (EL) is prepared on the anode electrode (AND). The organic layer (EL) may include a hole transporting layer, an organic light emitting layer, and an electron transporting layer. Furthermore, the organic layer (EL) may include at least one functional layer for improving light emission efficiency and/or lifespan of the light emitting layer.

The cathode electrode (CAT) is prepared on the organic layer (EL) and the bank (W). If a voltage is applied to the anode electrode (AND) and the cathode electrode (CAT), hole and electron are transferred to the organic light emitting layer via the hole transporting layer and the electron transporting layer, and are then combined with each other in the organic light emitting layer, to thereby emit light.

The encapsulation layer 180 is prepared on the thin film transistor (T) and the organic light emitting diode (OLED). In this instance, the link line area (LA), the first pad area (PA1), the gate link line area (GLA), and the second pad area (PA2) are not covered by the encapsulation layer 180. The encapsulation layer 180 protects the thin film transistor (T) and the organic light emitting diode (OLED) from an external shock, and prevents a moisture permeation into the inside of the organic light emitting display panel 100.

Additionally, a front adhesive layer 190 may be prepared on the encapsulation layer 180. The front adhesive layer 190 protects the thin film transistor (T) and the organic light emitting diode (OLED) from an external shock, and prevents a moisture permeation. In this instance, the link line area (LA), the first pad area (PA1), the gate link line area (GLA), and the second pad area (PA2) are not covered by the front adhesive layer 190. The front adhesive layer 190 may be a metal layer or a barrier film, but not necessarily.

The gate driving circuit 210 supplies gate signals to the gate lines in accordance with a gate control signal which is input from a timing controller 400. According to an embodiment of the present invention, the gate driving circuit 210 is a driving chip, in which the gate driving circuit 210 of the driving chip is mounted on the gate flexible film 230, and is attached to the second pad area (PA2) of the base film 110 in TAB (tape automated bonding) method, but not limited to this method. For example, the gate driving circuit 210 may be formed in GIP (gate driver in panel) method at one outer side or both outer sides of the display area (DA) of the organic light emitting display panel 100.

The second pad area (PA2) of the base film 110 may be exposed without being covered by the encapsulation layer 180. In the second pad area (PA2) which is not covered by the encapsulation layer 180 and exposed to the external, there are the second pads 170. The second pads 170 may be gate pads. The gate flexible film 230 is attached to the second pad area (PA2). In the gate flexible film 230, there may be lines for connecting the second pads 170 with the gate driving circuit 210. The gate flexible film 230 is attached onto the second pads 170 by the use of anisotropic conducting film, whereby the second pads 170 may be connected with the lines of the gate flexible film 230.

The source driving circuit 310 is provided with digital video data and source control signal from the timing controller 400. The source driving circuit 310 converts the digital video data into analog data voltages in accordance with a source control signal, and then supplies the analog data voltages to the first lines, that is, data lines. If the source driving circuit 310 is a driving chip, the source driving circuit 310 may be mounted on the source flexible film 330 by COF (chip on film) or COP (chip on plastic) method.

The first pad area (PA1) of the base film 110 may be exposed without being covered by the encapsulation layer 180. In the first pad area (PA1) which is not covered by the encapsulation layer 180 and exposed to the external, there are the first pads 160 such as data pads. The source flexible film 330 is attached to the first pads 160. In the source flexible film 330, there may be lines for connecting the first pads 160 with the source driving circuit 310, that is, lines for connecting the first pads 160 with the lines of the circuit board 350. The source flexible film 330 is attached onto the first pads 160 by the use of anisotropic conducting film, whereby the first pads 160 may be connected with the lines of the source flexible film 330.

The circuit board 350 may be attached to the source flexible film 330. A plurality of circuits formed in driving chips may be mounted on the circuit board 350. For example, the timing controller 400 may be mounted on the circuit board 350. The circuit board 350 may be a printed circuit board or flexible printed circuit board.

The timing controller 400 is provided with digital video data and timing signals from an external system board. The timing controller 400 generates a gate control signal for controlling an operation timing of the gate driving circuit 210 on the basis of the timing signal, and a source control signal for controlling an operation timing of the source driving circuits 310 on the basis of the timing signal. The timing controller 400 supplies the gate control signal to the gate driving circuit 210, and supplies the source control signal to the source driving circuits 310.

The organic light emitting display device according to an embodiment of the present invention is provided with the first pad area (PA1) which is extended and protruding out of the first side of the display area (DA) so that it is possible to reduce a stress between the base film and the inorganic films for a thermal treatment so as to form the thin film transistor (T). Thus, after the base film is separated from the auxiliary substrate, it is possible to prevent the pad area of the base film from being rolled (e.g., bent or curled).

Figure 5:
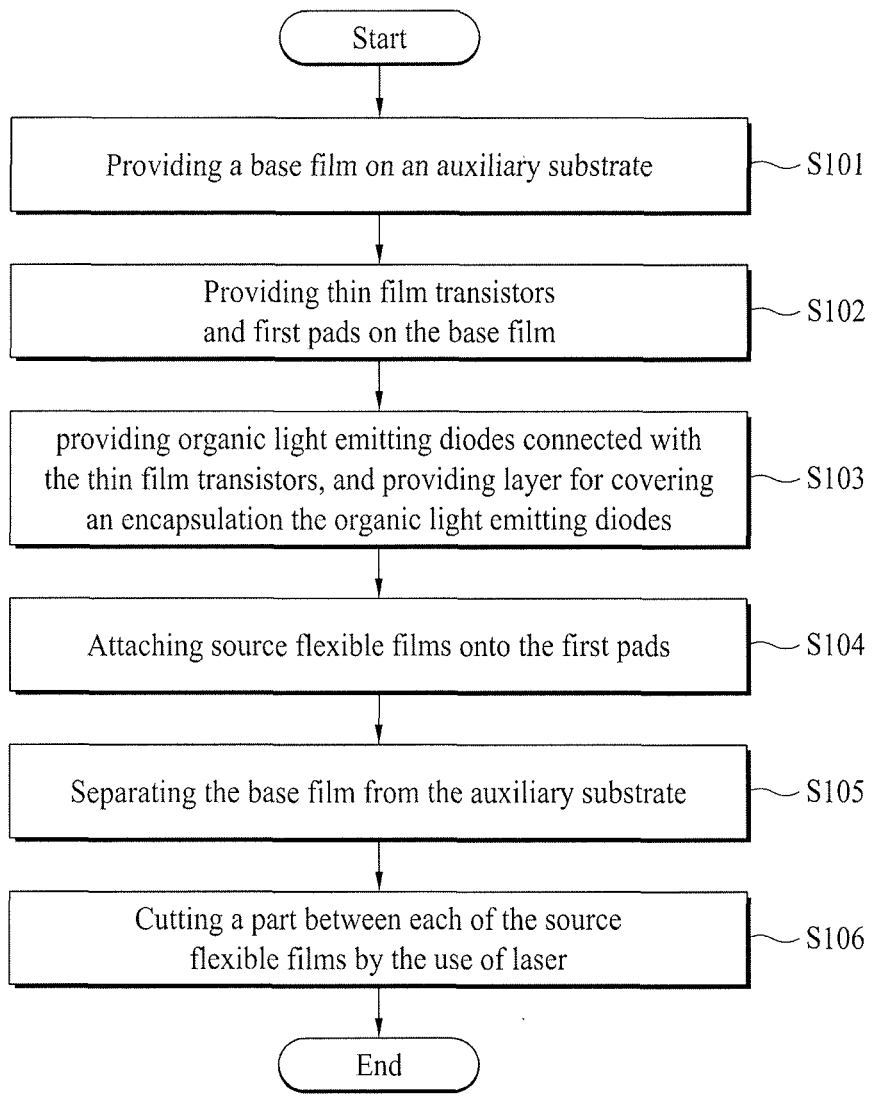
FIG. 5 is a flow chart illustrating a method for fabricating the OLED device according to an embodiment of the present invention.

FIG. 5 is a flow chart illustrating a method for fabricating the organic light emitting display device according to an embodiment of the present invention. FIGS. 6A to 6F are cross sectional views illustrating the method for fabricating the organic light emitting display device according to an embodiment of the present invention. FIGS. 7A and 7D are plane views illustrating steps S103, S104, and S106 of FIG. 5.

Figure 6A:
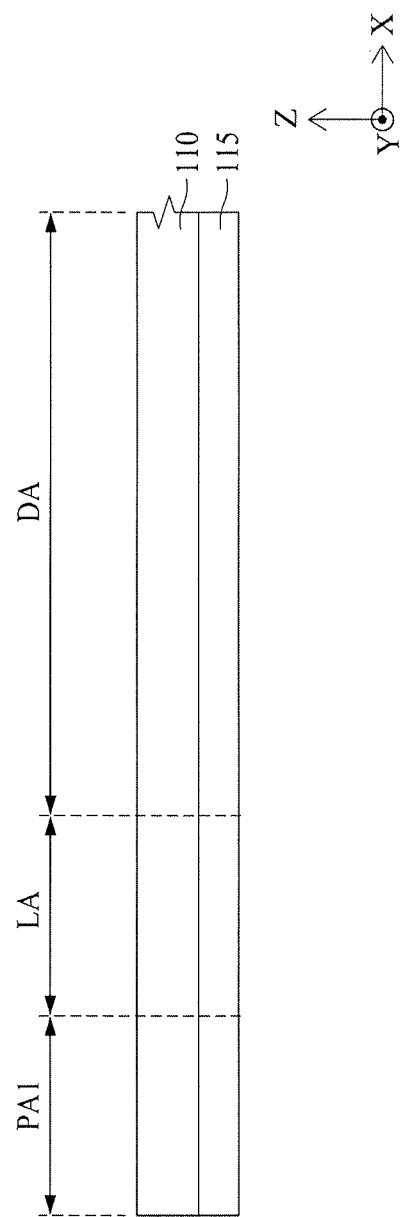
FIGS. 6A to 6F are cross sectional views illustrating a method for fabricating the OLED device according to an embodiment of the present invention.
Figure 7A:
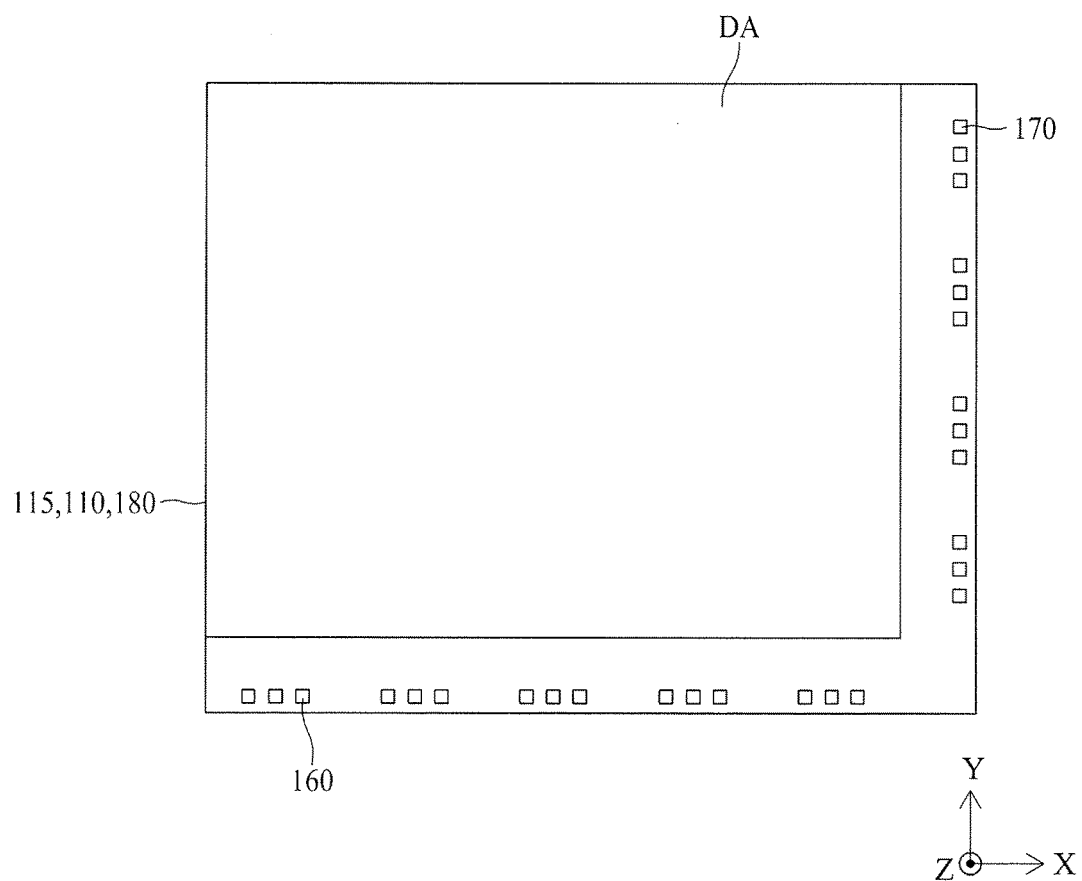
FIGS. 7A and 7D are plane views illustrating the steps S103, S104 and S106 of FIG. 5.

Firstly, as shown in FIG. 6A, the base film 110 is provided on the auxiliary substrate 115. For example, the base film 110 may be fabricated in a slit coating method. The slit coating method is a method of fabricating a thin flexible film by uniformly coating a liquid material for the base film 110 on the auxiliary substrate 115 through the use of nozzle, and curing the coated liquid material, but not limited to this method. The base film 110 may be fabricated in a roll coating method or a spin coating method. (S101 of FIG. 5)

Figure 6B:
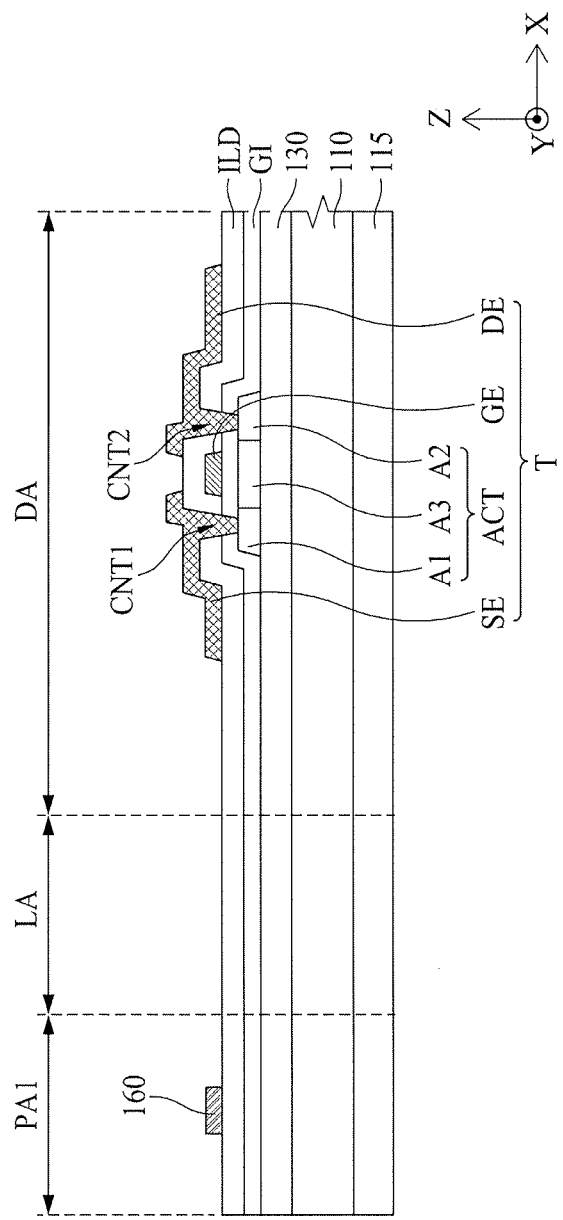

Secondly, as shown in FIG. 6B, the thin film transistors (T), the first pads 160, and the second pads 170 are provided on the base film 110. The buffer layer 130, the active layer (ACT), and the gate insulator (GI) are sequentially provided on the base film 110, the gate electrode (GE) which overlaps with the active layer (ACT) is provided on the gate insulator (GI) in the display area (DA), and then the second pads 170 are provided in the second pad area (PA2). In this instance, the gate electrode (GE) and the second pads 170 are fabricated at the same time by the same process, and are formed of the same material. Then, the interlayer dielectric (ILD) is provided on the gate electrode (GE). Thereafter, the source electrode (SE) and the drain electrode (DE), which are connected with the active layer (ACT) via the first and second contact holes (CNT1, CNT2), are provided on the interlayer dielectric (ILD), and then the first pads 160 are provided in the first pad area (PA1). In this instance, the source electrode (SE), the drain electrode (DE), and the first pads 160 are fabricated at the same time by the same process, and are formed of the same material. (S102 of FIG. 5)

Figure 6C:
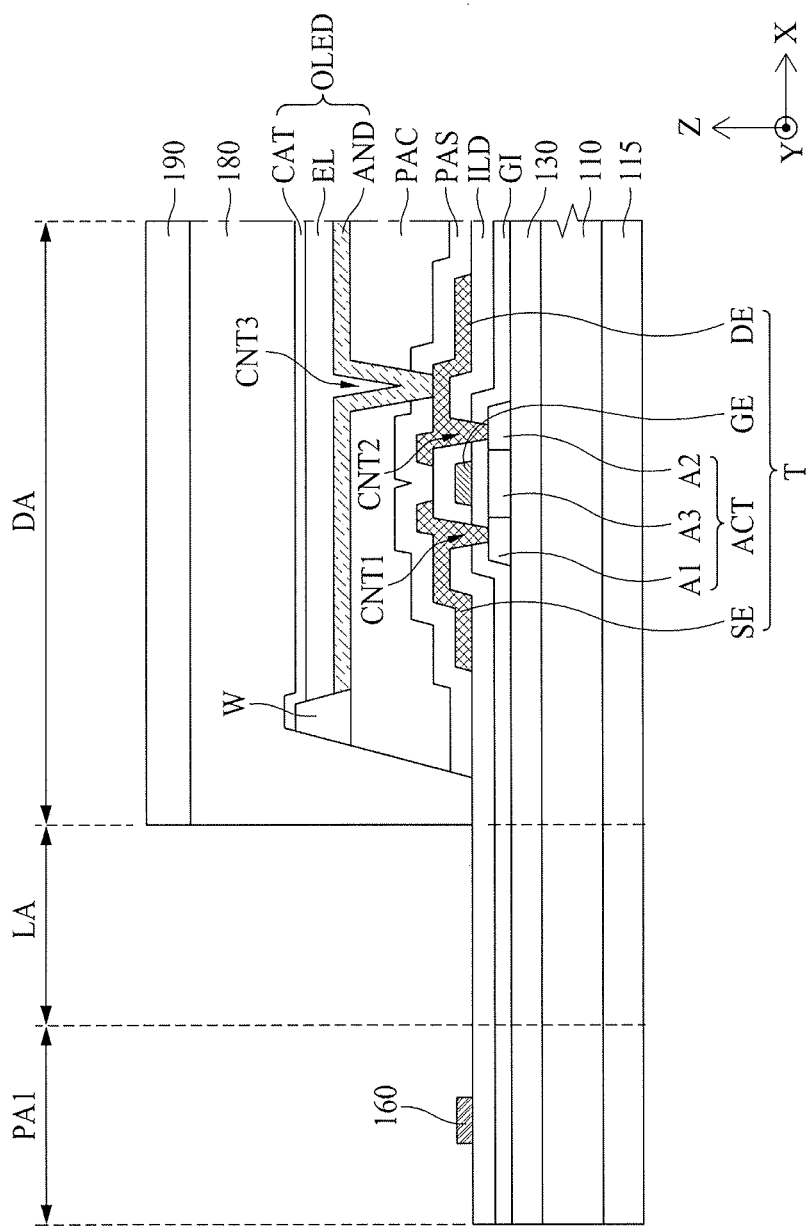

Thirdly, as shown in FIGS. 6C and 7A, after providing the organic light emitting diodes (OLED) which are connected with the thin film transistors (T), the encapsulation layer 180 is provided to cover the organic light emitting diodes (OLED). The passivation layer (PAS) and the planarization layer (PAC) are sequentially provided on the thin film transistors (T). The anode electrode (AND) is provided on the thin film transistor (T), and the anode electrode (AND) is connected with the drain electrode (DE) via the third contact hole (CNT3) prepared in the passivation layer (PAS) and the planarization layer (PAC). The bank (W) is provided between the neighboring anode electrodes (AND). The organic layer (EL) is provided on the anode electrode (AND), and the cathode electrode (CAT) is provided on the organic layer (EL) and the bank (W).

The encapsulation layer 180 is provided to cover the thin film transistor (T) and the organic light emitting diode (OLED). In this instance, the encapsulation layer 180 is not provided in the link line area (LA), the first pad area (PA1), and the second pad area (PA2). The front adhesive layer 190 may be additionally provided on the encapsulation layer 180. (S103 of FIG. 5)

Figure 6D:
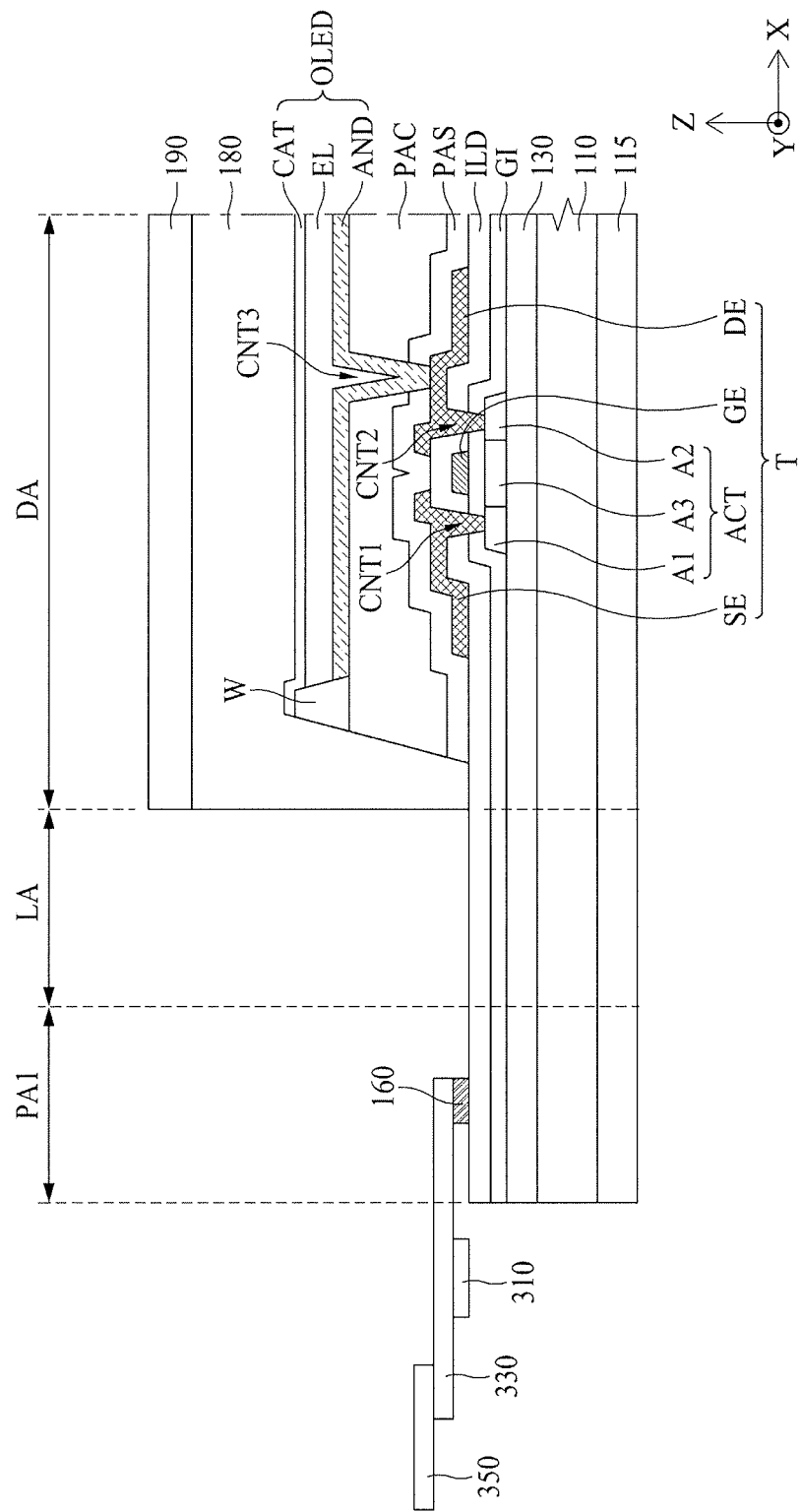
Figure 7B:
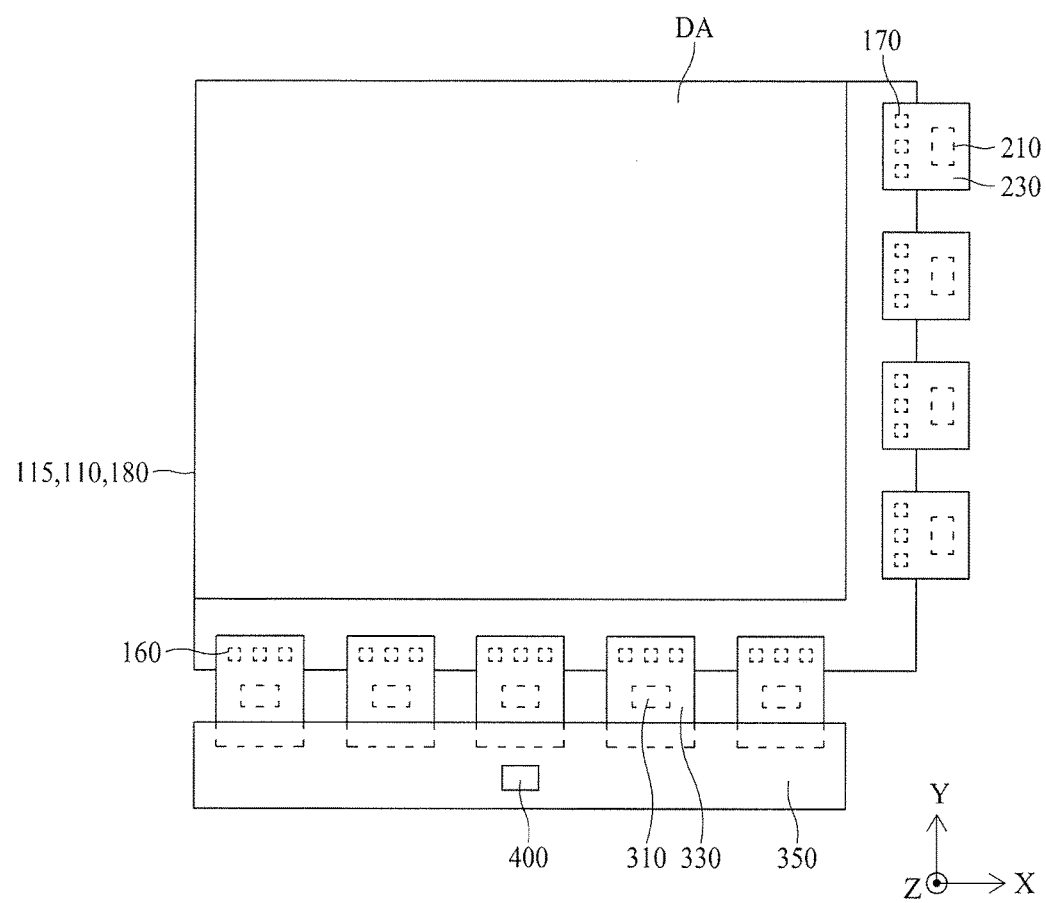

Fourthly, as shown in FIGS. 6D and 7B, the source flexible films 330 are attached onto the first pads 160, and the gate flexible films 230 are attached onto the second pads 170. In the source flexible film 330, there are the lines for connecting the first pads 160 with the source driving circuit 310, and the lines for connecting the first pads 160 with the lines of the circuit board 350. The source flexible film 330 is attached onto the first pads 160 by the use of anisotropic conducting film, whereby the first pads 160 are connected with the lines of the source flexible film 330. In the gate flexible film 230, there are the lines for connecting the second pads 170 with the gate driving circuit 210. The gate flexible film 230 is attached onto the second pads 170 by the use of anisotropic conducting film, whereby the second pads 170 are connected with the lines of the gate flexible film 230 (S104 of FIG. 5).

Figure 6E:
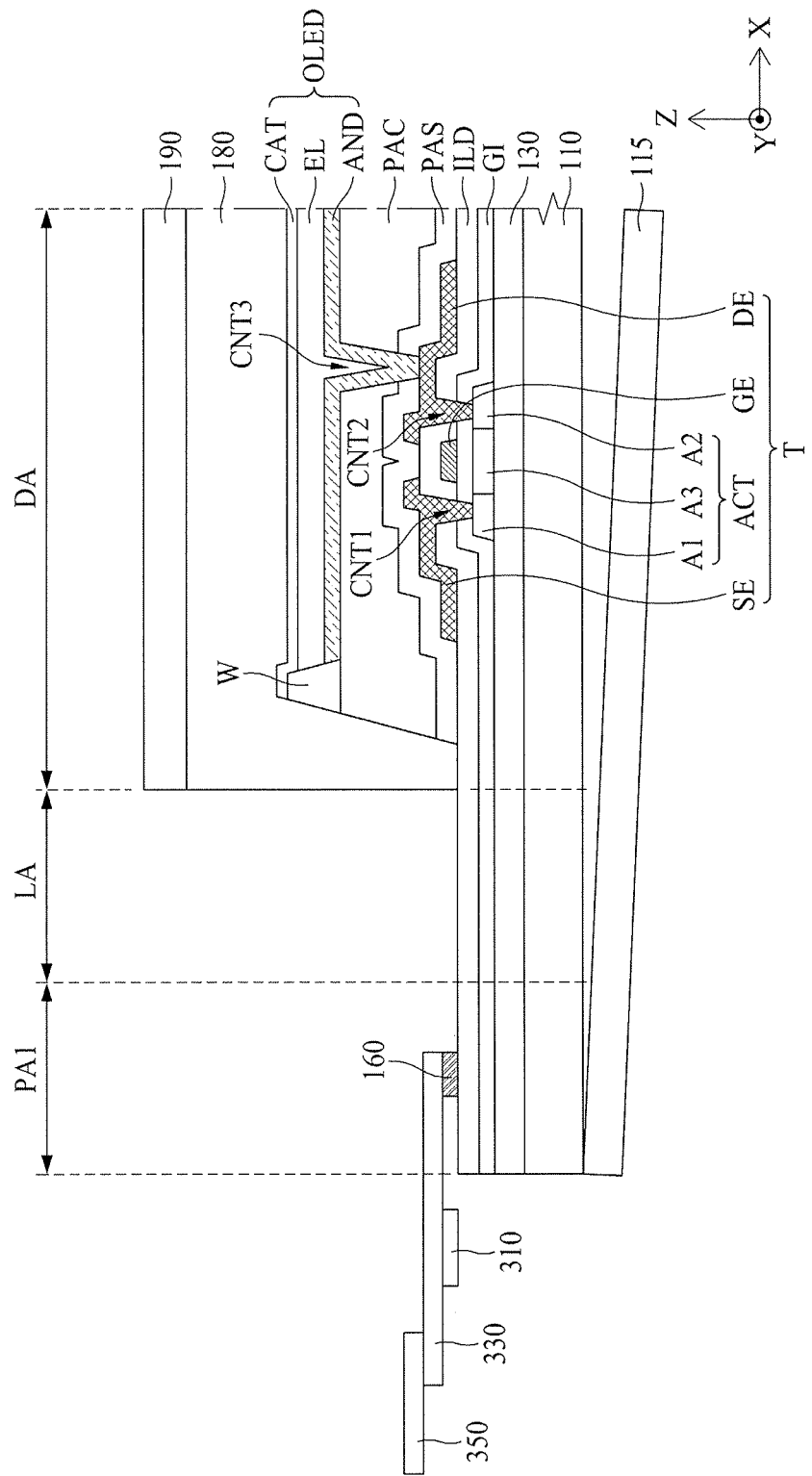

Fifthly, as shown in FIG. 6E, the base film 110 is separated from the auxiliary substrate 115. In this instance, the base film 110 and the auxiliary substrate 115 may be separated from each other by the use of laser. (S105 of FIG. 5)

Figure 6F:
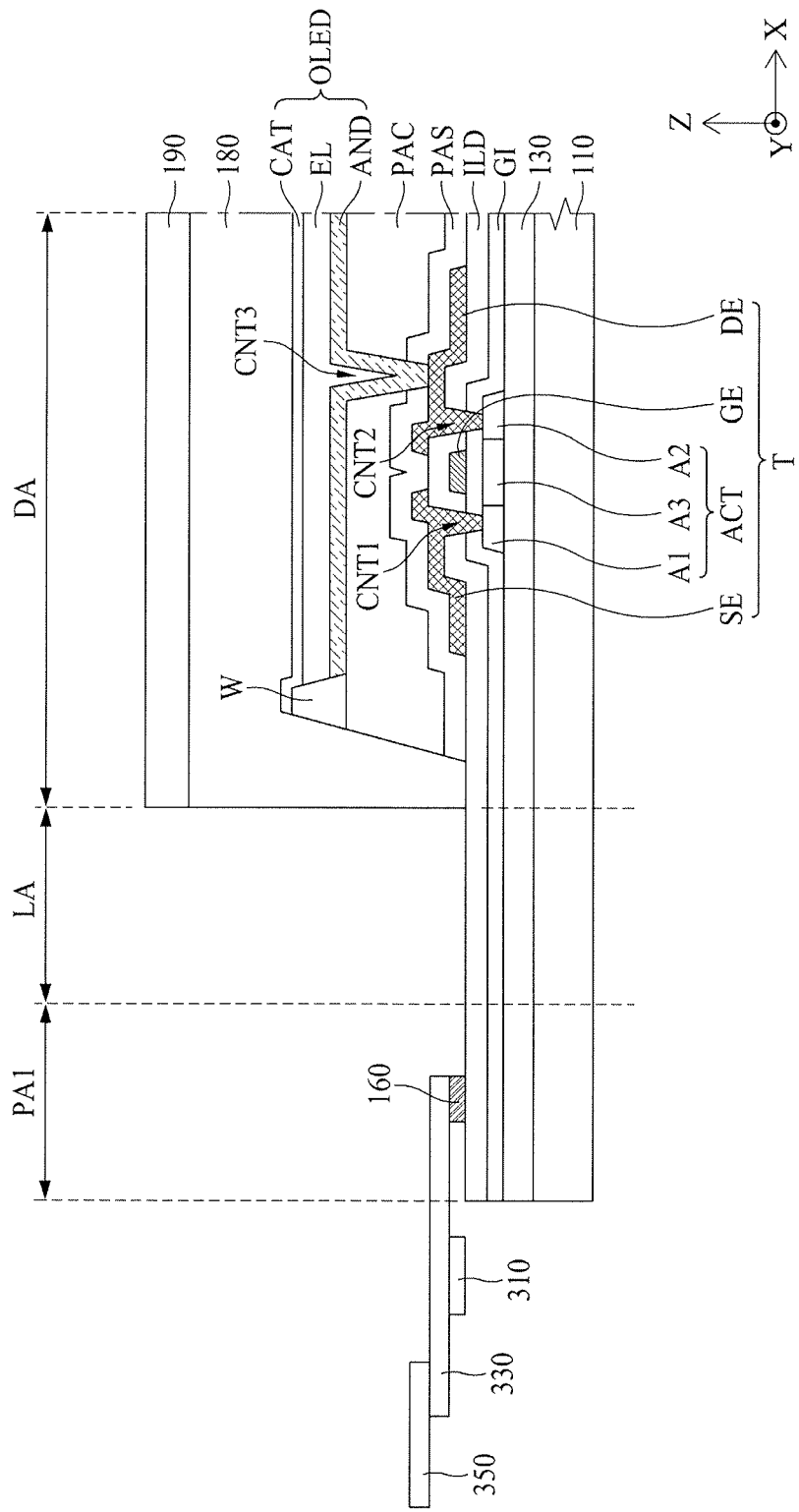
Figure 7C:
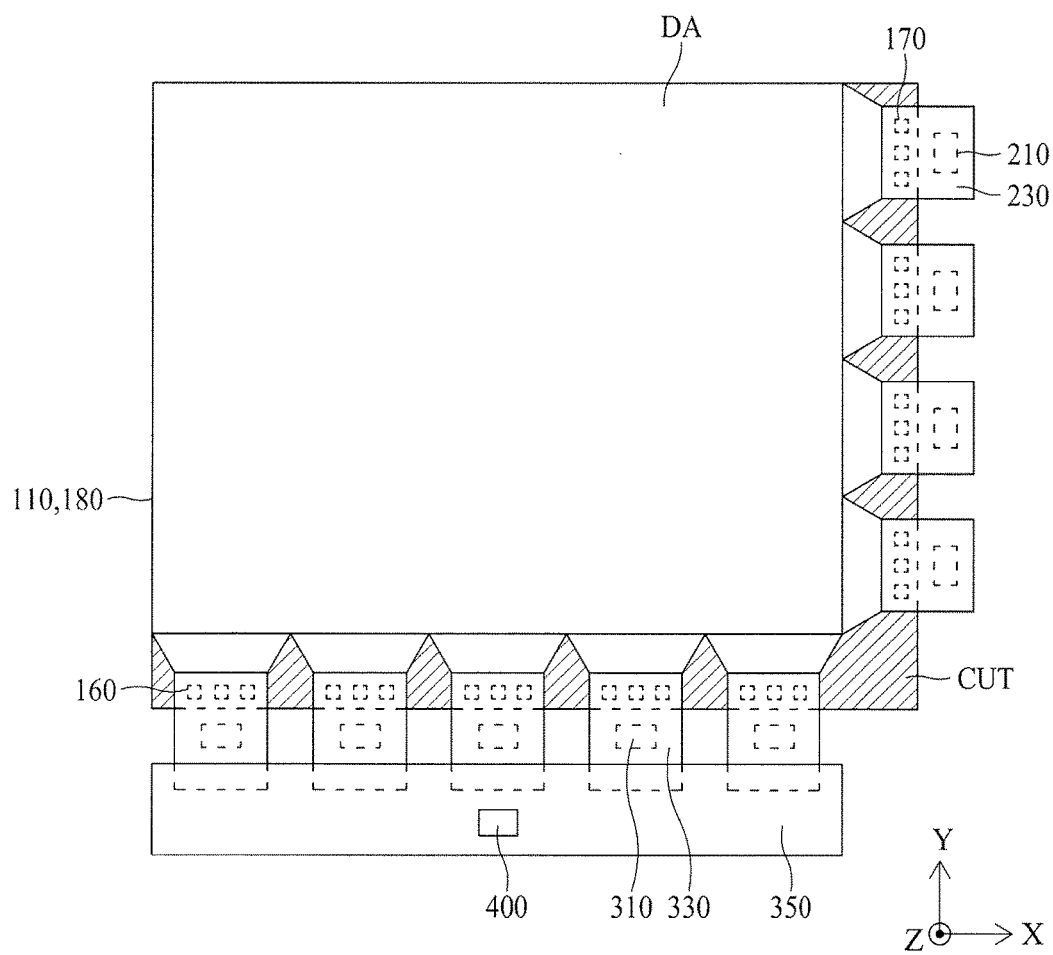
Figure 7D:
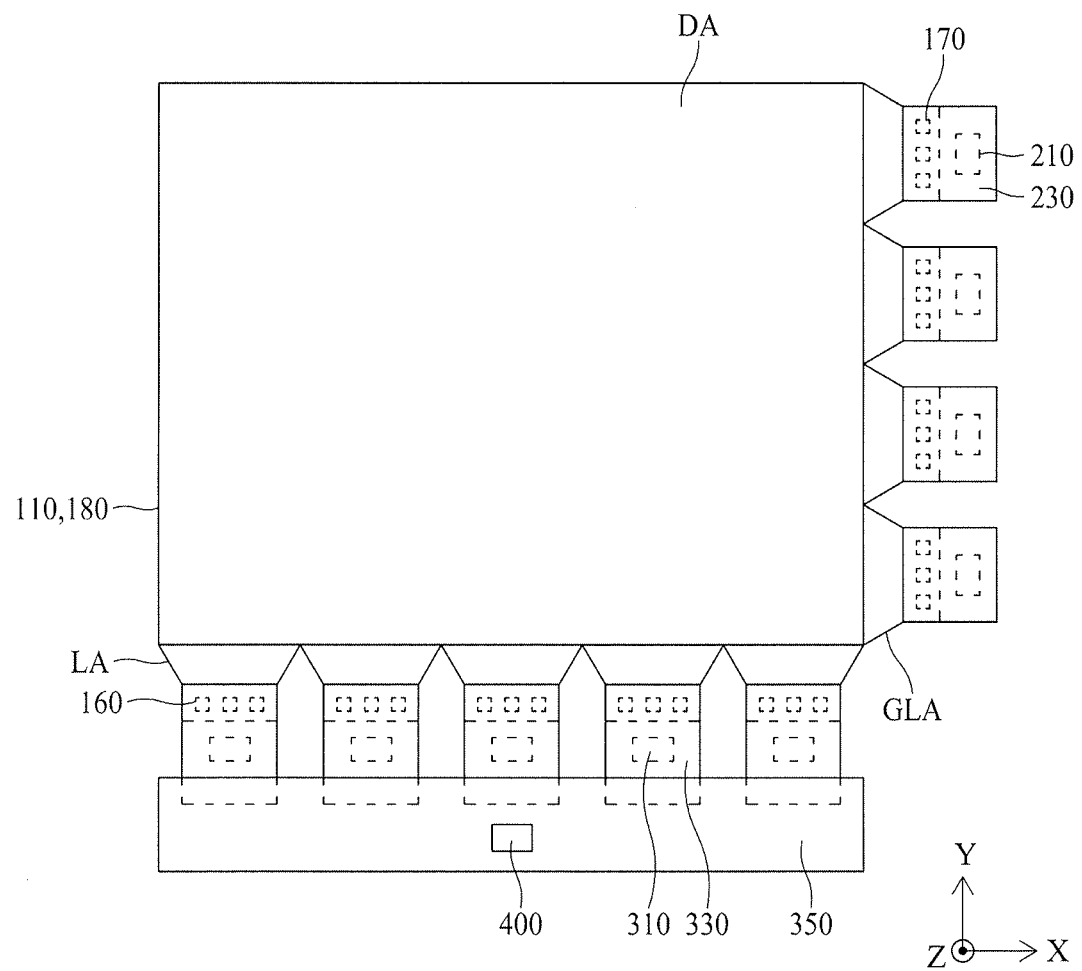

Finally, as shown in FIGS. 6F, 7C, and 7D, the base film 110 disposed between each of the source flexible films 330 is cut by the use of laser, and the base film 110 disposed between each of the gate flexible films 230 is cut by the use of laser. Accordingly, the base film 110 is divided into the display area (DA), the link line area (LA), the first pad area (PA1), the gate link line area (GLA), and the second pad area (PA2). The link line area (LA), the first pad area (PA1), the gate link line area (GLA), and the second pad area (PA2) are described in detail with reference to FIG. 2.

In more detail, as shown in FIG. 7C, since the cutting part (CUT) of the base film 110 disposed between each of the source flexible films 330 is cut by the use of laser, it is possible to provide the first pad area (PA1) so that it extends from and protrudes out of the first side of the display area (DA). In this instance, the cutting part (CUT) of the base film 110 corresponds to the area in which the link lines are not provided. Accordingly, it is possible to provide the link line area (LA) with the trapezoid shape without damaging the link lines.

Also, since the cutting part (CUT) of the base film 110 disposed between each of the gate flexible films 230 is cut by the use of laser, it is possible to provide the second pad area (PA2) which extends from and protrudes out of the second side of the display area (DA). In this instance, the cutting part (CUT) of the base film 110 corresponds to the area in which the gate link lines are not provided. Accordingly, it is possible to provide the gate link line area (GLA) with the trapezoid shape without damaging the gate link lines. (S106 of FIG. 5)

In the organic light emitting display device according to an embodiment of the present invention, the first pad area (PA1) is provided by cutting the base film 110 to have the shape which extends from and protrudes out of the first side of the display area (DA) so that it is possible to reduce the stress between the base film 110 and the inorganic films for the thermal treatment for fabricating the thin film transistor (T). As a result, even after the base film 110 is separated from the auxiliary electrode 115, it is possible to prevent the pad area of the base film 110 from being rolled (e.g., curled or bent).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising:
    a base film including a display area, and a first pad area provided with first pads, wherein the first pad area extends from and protrudes out of a first side of the display area;
    a plurality of thin film transistors on the base film; and
    a plurality of organic light emitting diodes on the thin film transistors,
    wherein the base film further includes a second pad area which extends from and protrudes out of a second side of the display area,
    wherein the second pad area is provided with second pads,
    wherein the OLED device further comprises an encapsulation layer disposed on the plurality of organic light emitting diodes,
    wherein the display area of the base film overlaps with the encapsulation layer,
    wherein both the first pad area of the base film and the second pad area of the base film do not overlap with the encapsulation layer, and
    wherein the first pad area of the base film includes first laser cutout portions and the second pad area of the base film includes second laser cutout portions.

2. The OLED device according to claim 1, wherein the base film is a flexible film.

3. The OLED device according to claim 1, further comprising a source flexible film attached to the first pad area, wherein a source driving circuit is mounted on the source flexible film.

4. The OLED device according to claim 3, further comprising a timing controller and a circuit board,
    wherein the timing controller, the circuit board, the source flexible film and the first pads are sequentially stacked on the first pad area of the base film.

5. The OLED device according to claim 4, wherein both the first pads and the source driving circuit are disposed on a first side of the source flexible film facing towards the first pad area of the base film and the circuit board is disposed on a second side of the source flexible film.

6. The OLED device according to claim 1, further comprising a gate flexible film attached to the second pad area,
    wherein a gate driving circuit is mounted on the gate flexible film.

7. The OLED device according to claim 1, further comprising a link line area disposed between the first pad area and the display area,
    wherein the link line area includes link lines for connecting the first pads with first lines of the display area.

8. The OLED device according to claim 7, wherein the link line area has a trapezoid shape.

9. The OLED device according to claim 1, wherein the first pad area has a trapezoid shape or a rectangular shape.

10. The OLED device according to claim 1, further comprising:
    a front adhesive layer prepared on the encapsulation layer.

11. The OLED device according to claim 10, wherein the first and second pad areas are not covered by the front adhesive layer.

12. The OLED device according to claim 1, further comprising a buffer layer disposed between the base film and the plurality of thin film transistors,
wherein the buffer layer includes at least one inorganic film.

13. The OLED device according to claim 1, further comprising an encapsulation layer disposed on the plurality of organic light emitting diodes,
wherein the base film is divided into the display area, the first pad area, a link line area between the display area and the first pad area, a second pad area provided with second pads, a gate link line area between the display area and the second pad area,
wherein the display area of the base film overlaps with the encapsulation layer, and
wherein the first pad area, the link line area, the second pad area, the gate link line area and the second pad area do not overlap with the encapsulation layer.

14. The OLED device according to claim 13, further comprising a front adhesive layer disposed on the encapsulation layer,
wherein the first pad area, the link line area, the second pad area, the gate link line area and the second pad area do not overlap with the front adhesive layer.

15. The OLED device according to claim 1,
wherein the first pads are divided into a plurality of first groups separated by the first laser cutout portions, and second pads are divided into a plurality of second groups separated by the second laser cutout portions.

16. The OLED device according to claim 15, wherein each of the plurality of first groups of the first pads are disposed on a trapezoid shaped portion of the base film defined by the first laser cutout portions, and
wherein each of the plurality of second groups of the second pads are disposed on a trapezoid shaped portion of the base film defined by the second laser cutout portions.

17. The OLED device according to claim 15, wherein each of the plurality of first groups of the first pads are disposed on a rectangular shaped portion of the base film defined by the first laser cutout portions, and
wherein each of the plurality of second groups of the second pads are disposed on a rectangular shaped portion of the base film defined by the second laser cutout portions.

18. A display device comprising:
a flexible substrate;
a plurality of thin film transistors on the flexible substrate; and
a plurality of organic light emitting diodes on the thin film transistors,
wherein the flexible substrate comprises:
a display area;
a first pad area provided with first pads, wherein the first pad area extends from and protrudes out of a first side of the display area; and
a link line area disposed between the first pad area and the display area, wherein the link line area includes link lines for connecting the first pads with first lines of the display area, and
wherein the link line area includes a cutting portion disposed between link lines connecting the first pads.

19. The display device according to claim 18, wherein the link line area has a trapezoid shape based on two cutting portions disposed on opposite sides of the link lines.

20. The display device according to claim 18, wherein each of the plurality of thin film transistors comprises:
an active layer;
a gate insulator disposed on the active layer;
a gate electrode disposed on the gate insulator and overlapped with the active layer;
an interlayer dielectric covering the gate electrode; and
a source electrode and a drain electrode disposed on the interlayer dielectric and spaced apart from each other.

21. The display device according to claim 20, wherein the first lines of the display area electrically connecting the link lines of the link line area and one of the source electrode and the drain electrode.

22. The display device according to claim 18, wherein the first pad area has at least one cutting portion dividing a plurality of first groups in which the first pads are disposed.

23. The display device according to claim 22, wherein the first pad area has a trapezoid shape or a rectangular shape based on two cutting portions disposed on opposite sides of each group among the plurality of first groups.

24. The display device according to claim 18, further comprising a source flexible film attached to the first pad area,
wherein a source driving circuit is mounted on the source flexible film.

25. The display device according to claim 18, wherein the flexible substrate further comprises a second pad area which extends from and protrudes out of a second side of the display area, and
wherein the second pad area is provided with second pads.

26. The display device according to claim 25, wherein the second pad area has at least one cutting portion dividing a plurality of second groups in which the second pads are disposed.

27. The display device according to claim 26, wherein the second pad area has a trapezoid shape or a rectangular shape based on two cutting portions disposed on opposite sides of each group among the plurality of second groups.

28. The display device according to claim 25, further comprising a gate flexible film attached to the second pad area,
wherein a gate driving circuit is mounted on the gate flexible film.

29. The display device according to claim 25, further comprising:
an encapsulation layer disposed on the plurality of organic light emitting diodes; and
a front adhesive layer disposed on the encapsulation layer.

30. The display device according to claim 29, wherein the encapsulation layer does not overlap with the first and second pad areas.

31. The display device according to claim 18, further comprising a buffer layer disposed between the flexible substrate and the plurality of thin film transistors,
wherein the buffer layer includes at least one inorganic film.

* * * * *